United States Patent
Zheng et al.

(10) Patent No.: US 7,969,728 B2
(45) Date of Patent: Jun. 28, 2011

(54) HEAT DISSIPATION DEVICE WITH A FAN HOLDER ATTACHED WITH A POSITION-ADJUSTABLE AIR GUIDING MEMBER

(75) Inventors: Dong-Bo Zheng, Shenzhen (CN); Meng Fu, Shenzhen (CN); Chun-Chi Chen, Taipei Hsien (TW)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 199 days.

(21) Appl. No.: 12/399,027

(22) Filed: Mar. 6, 2009

(65) Prior Publication Data

US 2009/0316358 A1    Dec. 24, 2009

(30) Foreign Application Priority Data

Jun. 20, 2008    (CN) .......................... 2008 1 0067940

(51) Int. Cl.
*H05K 7/20* (2006.01)
*F28F 7/00* (2006.01)
*H01L 23/34* (2006.01)

(52) U.S. Cl. ......... 361/679.51; 361/679.47; 361/679.49; 361/679.52; 361/697; 361/700; 361/709; 165/80.4; 165/80.5; 165/104.33; 257/715; 257/722; 174/15.2; 174/16.3

(58) Field of Classification Search ............. 361/679.47, 361/679.49–679.52, 679.54, 697, 700, 703, 361/709, 719; 165/80.1–80.5, 104.33, 185; 257/715, 718, 719, 722; 174/15.2, 16.3, 174/252

See application file for complete search history.

(56) References Cited

U.S. PATENT DOCUMENTS

| 6,970,353 | B2 * | 11/2005 | Brovald et al. | ............ 361/679.5 |
| 7,215,548 | B1 * | 5/2007 | Wu et al. | ........................ 361/703 |
| 7,363,963 | B2 * | 4/2008 | Wang et al. | .................. 165/80.3 |
| 7,403,389 | B2 * | 7/2008 | Yao et al. | ....................... 361/695 |
| 7,447,028 | B2 * | 11/2008 | Lai et al. | ........................ 361/697 |
| 7,495,912 | B2 * | 2/2009 | Long et al. | .................... 361/697 |
| 7,766,074 | B2 * | 8/2010 | Lin et al. | ...................... 165/80.2 |
| 2007/0097654 | A1 * | 5/2007 | Hao et al. | ...................... 361/719 |
| 2007/0145572 | A1 * | 6/2007 | Chen et al. | .................... 257/718 |
| 2008/0019094 | A1 * | 1/2008 | Xia et al. | ....................... 361/700 |
| 2010/0212863 | A1 * | 8/2010 | Liu et al. | ....................... 165/80.3 |

* cited by examiner

Primary Examiner — Zachary M Pape
(74) Attorney, Agent, or Firm — Frank R. Niranjan (57) ABSTRACT

A heat dissipation device includes a heat sink having a plurality of fins defining a plurality of passageways therebetween. The passageways have an inlet and an outlet at front and rear sides of the heat sink. Two adjusting members are mounted at two lateral sides of the heat sink. A fan is located at the inlet of the passageways of the heat sink for providing airflow to the heat sink. A guiding member is positioned at the outlet of the passageways of the heat sink for guiding the airflow to electronic components around the heat dissipation device. The guiding member engages the adjusting members and can move vertically relative to adjusting members, thereby adjusting a height of the guiding member along a height of the heat sink.

13 Claims, 7 Drawing Sheets

HEAT DISSIPATION DEVICE WITH A FAN HOLDER ATTACHED WITH A POSITION-ADJUSTABLE AIR GUIDING MEMBER

BACKGROUND OF THE DISCLOSURE

1. Field of the Disclosure

The disclosure relates to heat dissipation devices and, more particularly, to a heat dissipation device having a fan holder for cooling an electronic component, such as an integrated circuit package, wherein a position-adjustable air guiding member is attached to the fan holder.

2. Description of Related Art

It is well known that, during operation of a computer, electronic devices such as central processing units (CPUs) frequently generate large amounts of heat. The heat must be quickly removed from the electronic device to prevent it from becoming unstable or being damaged. Typically, a heat dissipation device is attached to an outer surface of the electronic device to absorb heat from the electronic device. The heat absorbed by the heat sink is then dissipated to ambient air.

Generally, a heat dissipation device mainly comprises a heat conducting base and a plurality of heat dissipating fins extending from one face of the base. For enhancing the heat dissipation efficiency of the heat dissipation device, a fan is typically desired to be combined thereto to provide forced convection airflow to the fins of the heat dissipation device. In use, the base has a face opposite the fins attached to an electronic device to absorb heat generated by the electronic device; then, the heat reaches the fins to be dissipated to the ambient air. With the development of computer industry, electronic devices of the computer become more and more powerful. And more and more electronic devices need heat dissipation. Therefore, the heat dissipation device has been continuously improved to meet the demand of heat dissipation of the electronic devices in the computer. Furthermore, the distribution of the airflow generated by the fan through the fins should be adjustable so that the heat dissipation device can be used to meet different layouts of the mother board requiring different cooling configurations.

What is needed, therefore, is a heat dissipation device which can not only dissipate the heat generated by the CPU but also dissipate the heat by other electronic components beside the CPU. Furthermore, the heat dissipation device has an adjustable airflow distribution configuration so that the heat dissipation device can meet different heat dissipation requirements.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION OF THE DISCLOSURE

Figure 1:
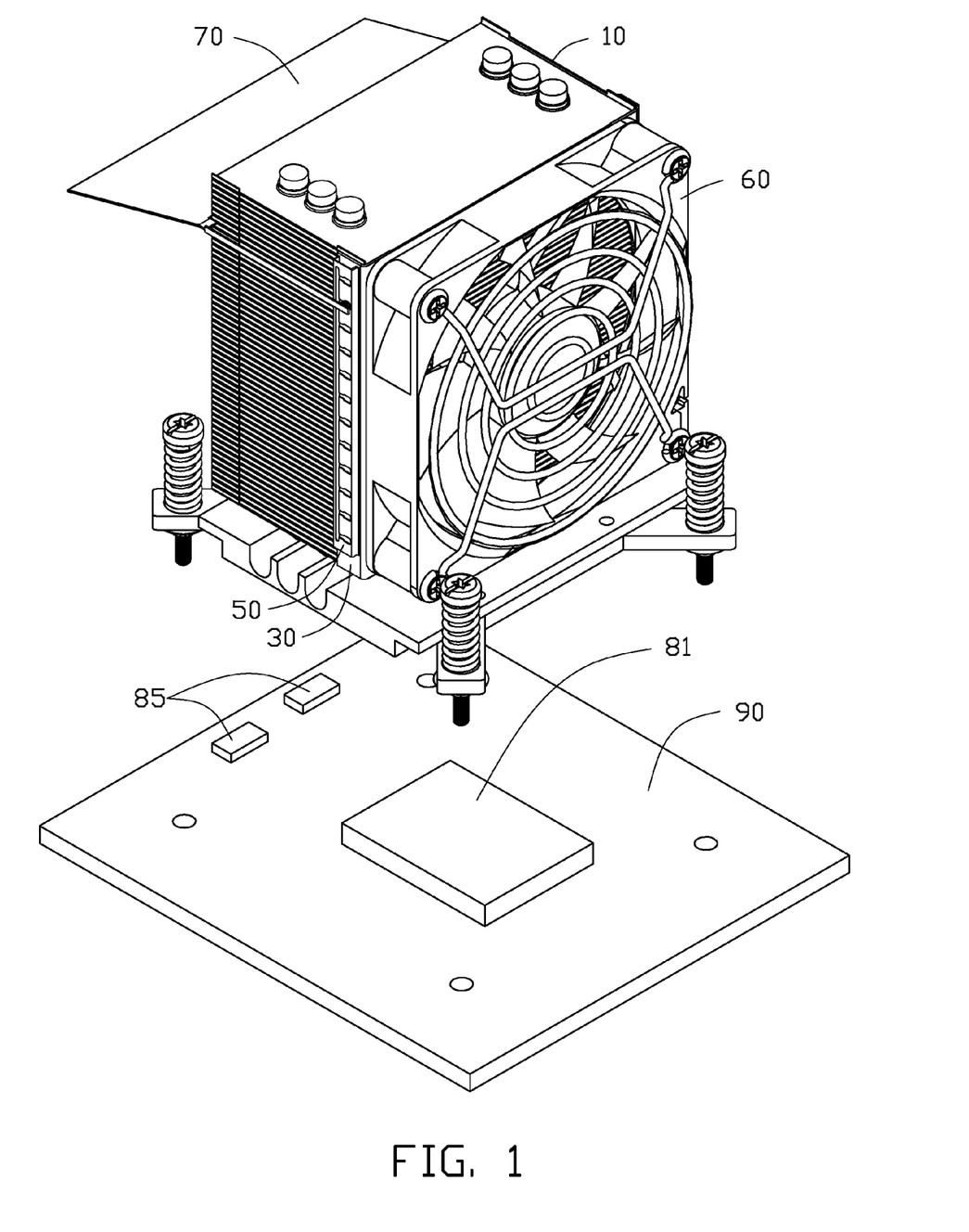
FIG. 1 is an assembled, isometric view of a heat dissipation device in accordance with an embodiment of the present disclosure, together with a plurality of electronic components mounted on a printed circuited board.
Figure 2:
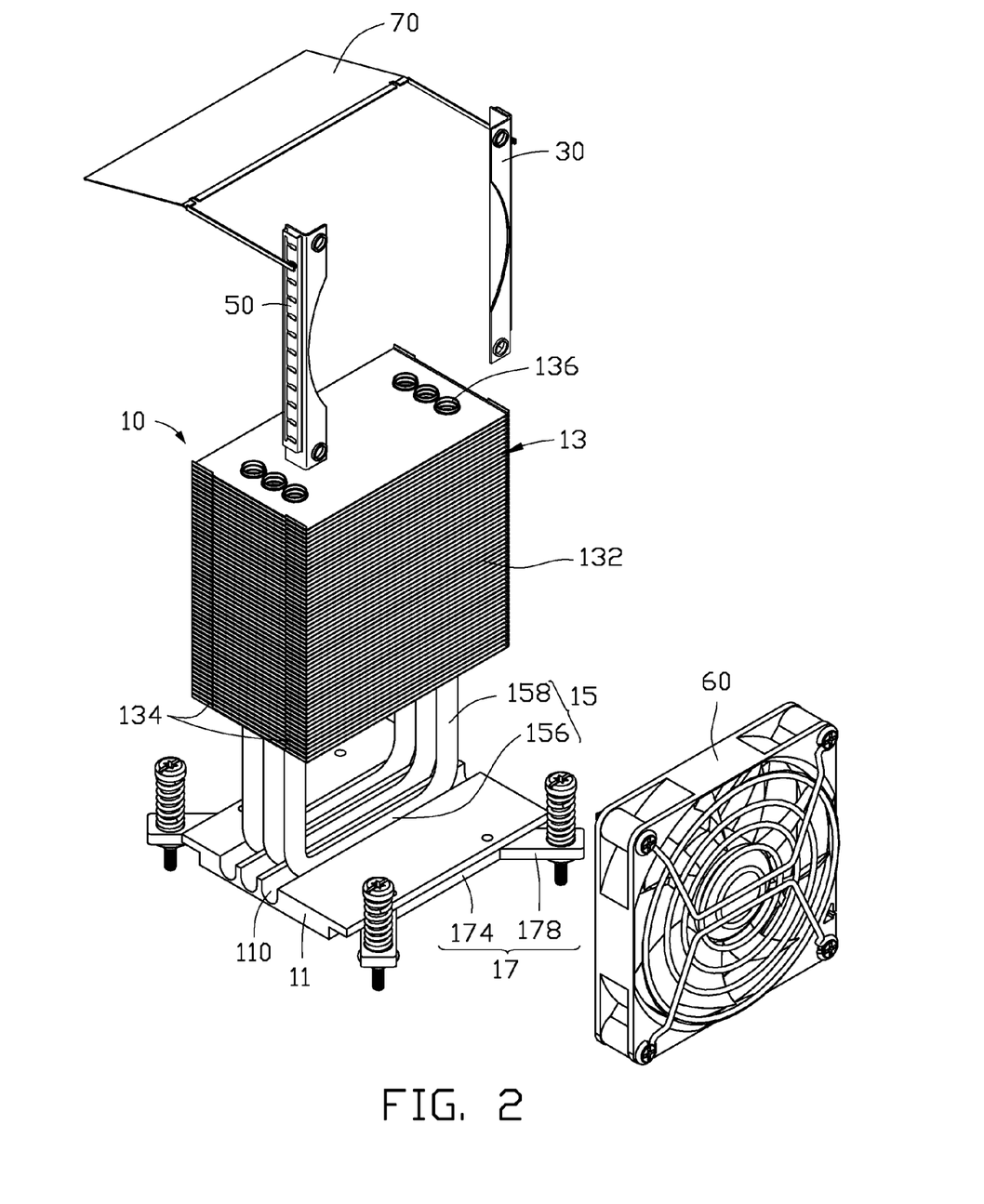
FIG. 2 is an exploded view of the heat dissipation device of FIG. 1.

Referring to FIGS. 1-2, a heat dissipation device in accordance with an embodiment of the disclosure is shown. The heat dissipation device is for being mounted to a printed circuit board 90 to remove heat from a main heat-generating electronic component 81 mounted on the printed circuit board 90, such as a CPU, and secondary heat-generating electronic components 85 located beside the main heat-generating electronic component 81 and around the heat dissipation device, such as power chips and capacitors. The heat dissipation device comprises a heat sink 10, a fan holder (not labeled) attached to the heat sink 10, a fan 60 mounted on the fan holder to provide forced airflow to the heat sink 10, two adjusting members 50 attached to the fan holder, and an air guiding member 70 attached to the adjusting members 50. A level of the air guiding member 70 is adjustable by moving the air guiding member 70 along the fan holder.

The heat sink 10 comprises a heat spreader 11, a fin assembly 13, three parallel U-shaped heat pipes 15 thermally connecting the heat spreader 11 and the fin assembly 13, and two locking members 17 engaging with two opposite sides of a bottom face of the heat spreader 11 to secure the heat sink 10 to the printed circuit board 90.

The heat spreader 11 has a rectangular configuration. The bottom face of the heat spreader 11 is for contacting the main heat-generating electronic component 81 to absorb heat therefrom. The heat spreader 11 defines three parallel grooves 110 in a top thereof. The locking members 17 each have a main body 174 attached to a corresponding side of the bottom face of the heat spreader 11 and a pair of ears 178 extending from two ends of the main body 174. The heat spreader 11 thermally engages the main heat-generating electronic component 81 on the printed circuit board 90 by bringing four fasteners (not labeled) to extend through the four ears 178 and threadedly engage a retainer (not shown) attached to a bottom side of the printed circuit board 90.

Each heat pipe 15 comprises a horizontal evaporation portion 156 and a pair of vertical condensation portions 158 extending upwardly and parallelly from two opposite ends of the evaporation portion 156. The evaporation portions 156 of the heat pipes 15 are soldered in the grooves 110 of the heat spreader 11. The condensation portions 158 extend upwardly through the fin assembly 13.

The fin assembly 13 consists of a plurality of parallel fins 132 stacked together. Each fin 132 is parallel to the heat spreader 11. The fins 132 are perforated with three pairs of through holes 136, corresponding to the condensing portions 158 of the three heat pipes 15. Each fin 132 forms an annular protrusion (not labeled) around a corresponding through hole 136. The condensing portions 158 of the heat pipes 15 are received in the through holes 136 and soldered to the protrusions so that the fins 132 are combined with the condensation portions 158 of the heat pipes 15 and form a plurality of horizontal channels (not labeled) therebetween. Four flanges 134 extend upwardly from two ends of two lateral sides of each fin 132. Each flange 134 has a height the same as that of the protrusions. The flanges 134 also help to form the horizontal channels among the fins 132.

Figure 3:
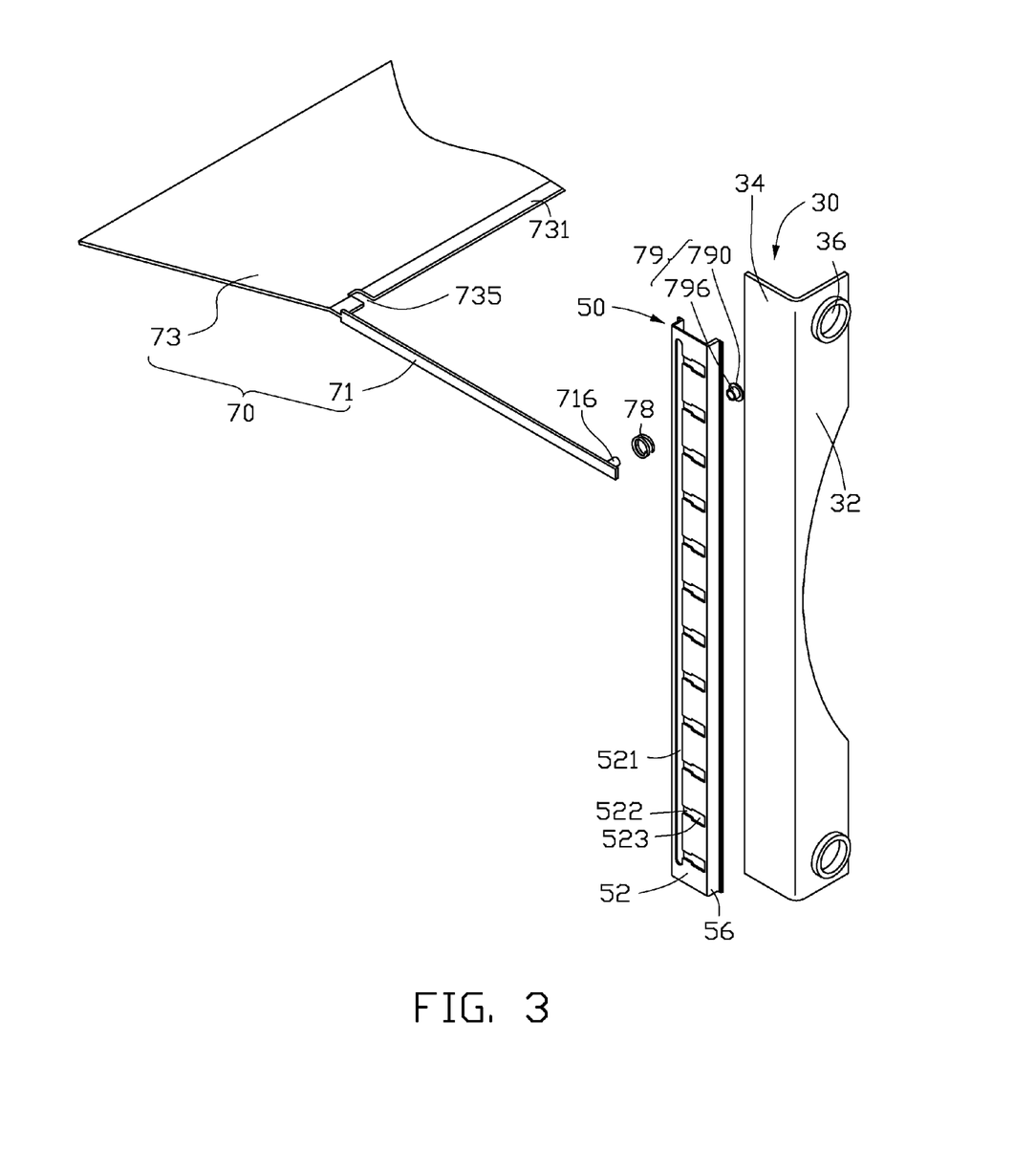
FIG. 3 is an exploded view of a mounting bracket, a guiding member, and an adjusting member of the heat dissipation device of FIG. 1.

Also referring to FIG. 3, the fan holder comprises a pair of mounting brackets 30 vertically attached on two lateral sides of the fin assembly 13. Each of mounting brackets 30 comprises an elongated lateral wall 34 and a mounting plate 32 extending perpendicularly from an edge of the lateral wall 34. Each mounting bracket 30 is vertical to the heat spreader 11. The lateral walls 34 of the mounting brackets 30 are soldered to the flanges 134 at two lateral sides of the fin assembly 13 and the mounting plates 32 are located on a front side of the fin assembly 13. The mounting plate 32 of each mounting bracket 30 defines a pair of holes 36 at top and bottom ends thereof. The holes 36 correspond to corners of the fan 60.

Each of the adjusting members 50 is elongated and attached on an outer surface of the lateral wall 34 of each mounting bracket 30. Each adjusting member 50 comprises a main plate 52 and two supporting walls 56 extending from two opposite edges of the main plate 52. The main plate 52 is parallel to the lateral wall 34 of each mounting bracket 30. The supporting walls 56 are securely mounted on the lateral wall 34 by soldering and space the main plate 52 a distance from the lateral wall 34. The main plate 52 defines a vertical recess 521 parallel and adjoining to an edge thereof, a plurality of rectangular, horizontally-extended position holes 523 near the other edge thereof, and a plurality of horizontal recesses 522 communicating the vertical recess 521 with the position holes 523. The vertical recess 521 is defined from bottom end to top end of the main plate 52. The position holes 523 are equidistantly distributed in the main plate 52 along a vertical direction thereof. The horizontal recesses 522 are perpendicular to the vertical recess 521. Each of the horizontal recesses 522 has a height dimensioned the same as that of a width of the vertical recess 521 and smaller than that of a height of each position hole 523.

Figure 4:
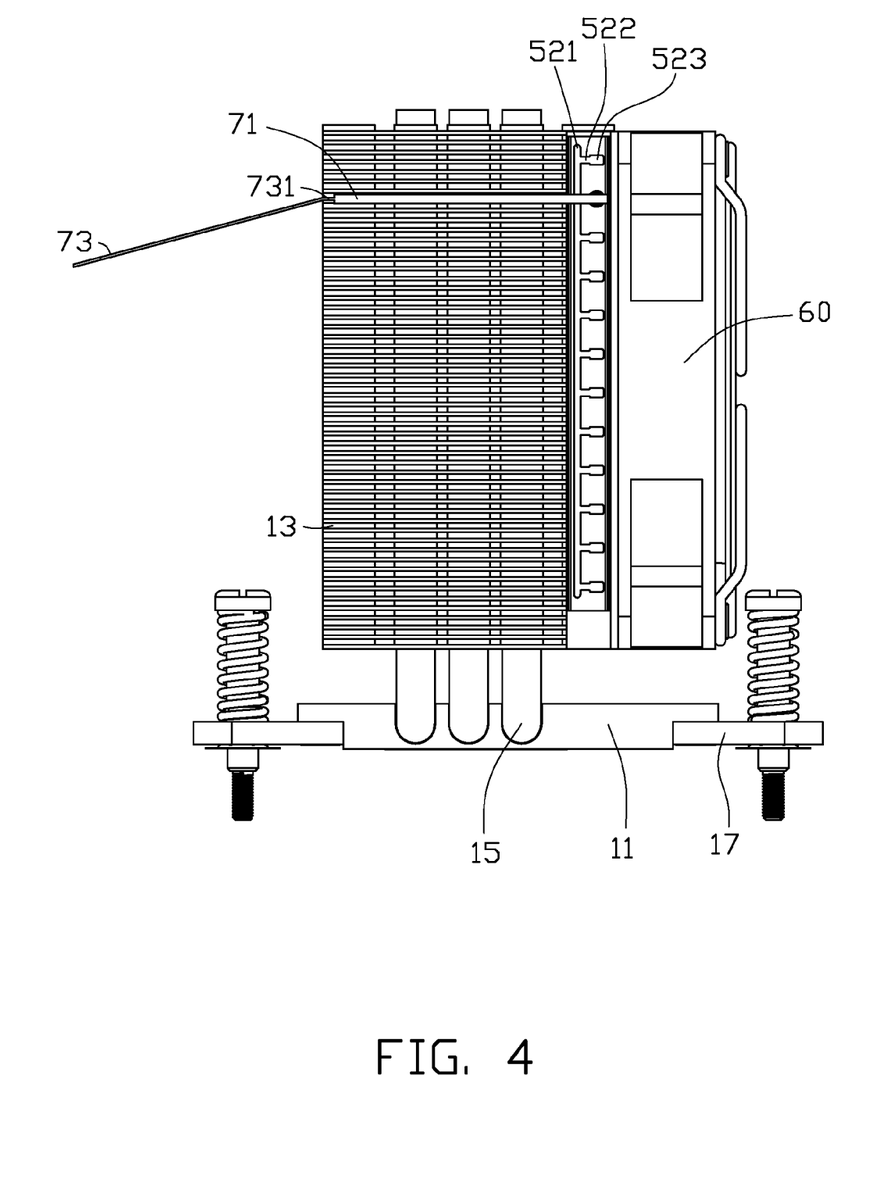
FIG. 4 is a side view of the heat dissipation device of FIG. 1.

Referring also to FIG. 4, the guiding member 70 is positioned at a back side of the fin assembly 13 opposite to the fan 60. The guiding member 70 comprises a pair of fixing arms 71 engaging the adjusting members 50 and a guiding plate 73 interconnecting back ends of the fixing arms 71. Each fixing arm 71 extends a movable portion 716, such as a pin, from an inner side of a front end thereof. The movable portion 716 has a diameter smaller than the width of the vertical recess 521 and the height of each horizontal recess 522 so that the movable portion 716 can be movable in the horizontal recesses 522 and the vertical recess 521. The guiding plate 73 extends from the fixing arms 71 downwardly and rearwards. The guiding plate 73 further extends a horizontal tongue 731 at a front edge thereof and located between the pair of fixing arms 71. The tongue 731 is inserted in the fin assembly 13 and between two adjacent fins 132 for securing the guiding plate 73 to the fin assembly 13. The tongue 731 defines two notches 735 at two ends thereof for receiving the flanges 134 of a corresponding fin 132.

The guiding member 70 further comprises two fasteners 79 connecting the movable portions 716, respectively. Each of the fasteners 79 has an engaging portion 796 connecting with the movable portion 716 and a blocking portion 790 formed at an end of the engaging portion 796 distant from the movable portion 716. The engaging portion 796 of each fastener 79 has a diameter larger than the height of the horizontal recess 522 and smaller than the height of the position hole 523. The blocking portion 790 of each fastener 79 has a diameter larger than the height of the position hole 523. The engaging portion 796 of each fastener 79 securely receives a free end of a corresponding movable portion 716 therein. The engaging portion 796 of the fastener 79 can be inserted in the position hole 523. Two helical springs 78 sleeve the movable portions 716 of the fixing arms 71 and parts of the engaging portions 796 of the fasteners 79 protruding from outer faces of the main plates 52. Each spring 78 has an outer diameter larger than the height of each position hole 523 and an inner diameter larger than the diameter of the movable portion 716 and the diameter of the engaging portion 796 of each fastener 79. Each spring 78 is sandwiched between the main plate 52 of each adjusting member 50 and each fixing arm 71 of the guiding member 70.

In assembly of the heat dissipation device, the mounting brackets 30 are positioned at lateral sides of a front face of the fin assembly 13. The fan 60 is mounted on the mounting brackets 30 to be located in front of the front face of the fin assembly 13. The tongue 731 of the guiding member 70 is inserted in the fin assembly 13 to be positioned between two adjacent fins 132. The fixing arms 71 are horizontally positioned at two lateral sides of the adjusting members 50 which are soldered on the mounting brackets 30. The engaging portion 796 of the fastener 79 extends through a corresponding position hole 523, whereby the guiding member 70 is fixed to the heat sink 10, with the guiding plate 73 tilting downwardly away from the fin assembly 13 of the heat sink 10.

In use, the heat spreader 11 of the heat sink 10 contacts the main heat-generating electronic component 81 to absorb heat therefrom. The heat in the heat spreader 11 is transferred to the fin assembly 13 by the heat pipes 15. The fan 60 works and provides forced airflow to the fin assembly 13 wherein the forced airflow flows from the front face of the fin assembly 13 to a rear face thereof. The airflow passes through the passageways of the fin assembly 13 and removes the heat in the fins 132. At the rear side of the fin assembly 13, a portion of the airflow out of the fin assembly 13 is guided by the guiding plate 73 downwardly to blow the secondary heat-generating electronic components 85 located aside the main heat-generating electronic component 81; therefore, the heat generated by the secondary generating electronic components 85 is also removed by the heat dissipation device.

Figure 5:
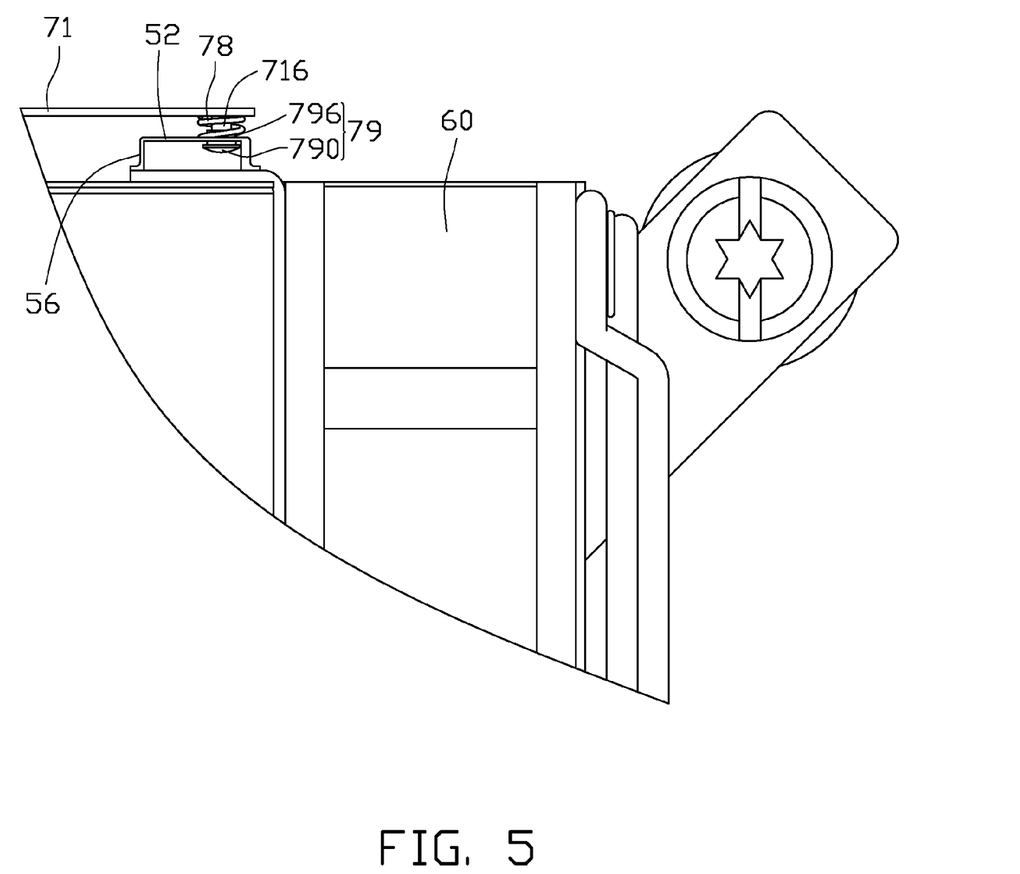
FIG. 5 is an enlarged, partial, top view of the heat dissipation device of FIG. 4, with the guiding member engaging the adjusting member in a locked position.

Referring to FIG. 5, the fixing arms 71 of the guiding member 70 are pushed outwards from the main plate 52 of the adjusting members 50 by the springs 78. The engaging portion 796 of each fastener 79 is brought to insert into the corresponding position hole 523 of each adjusting member 50. Since the diameter of each engaging portion 796 is larger than the height of each horizontal recess 522, each engaging portion 796 cannot slide along the horizontal recess 522. The engaging portions 796 firmly engaged in the position holes 523. Thus, the guiding member 70 is in a locked position with a predetermined height relative to the printed circuit board 90.

Figure 6:
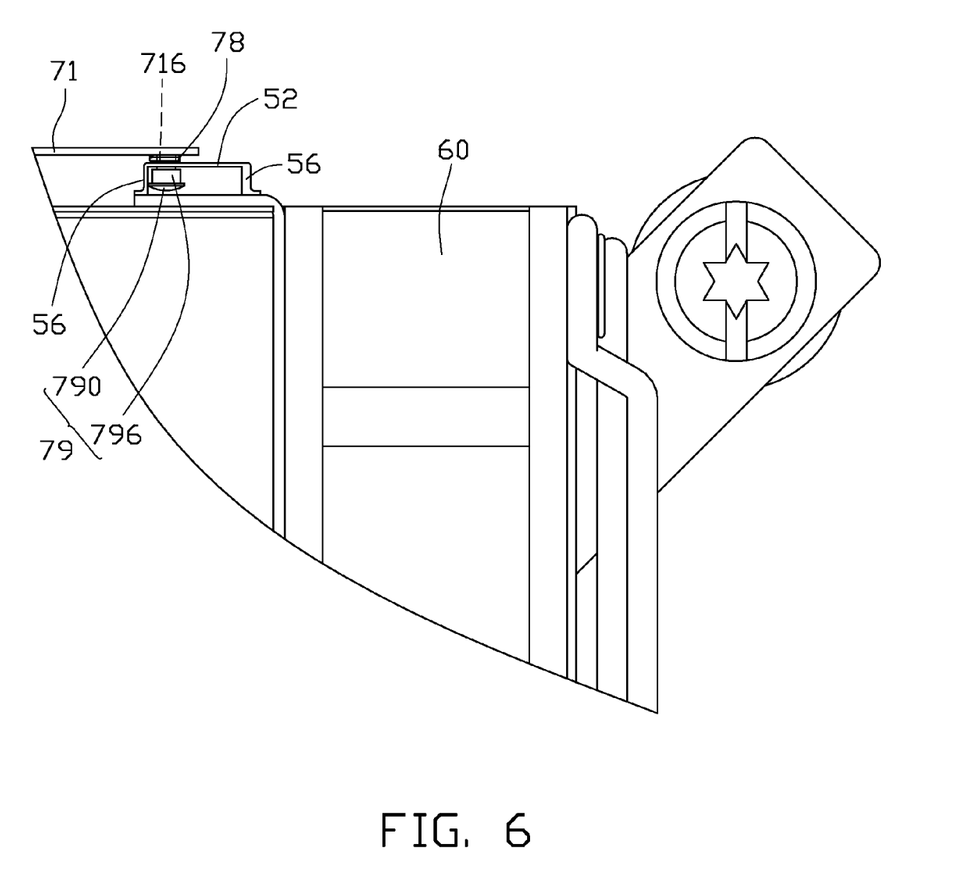
FIG. 6 is a view similar to FIG. 5, with the guiding member being moved along the adjusting member to leave the locked position.
Figure 7:
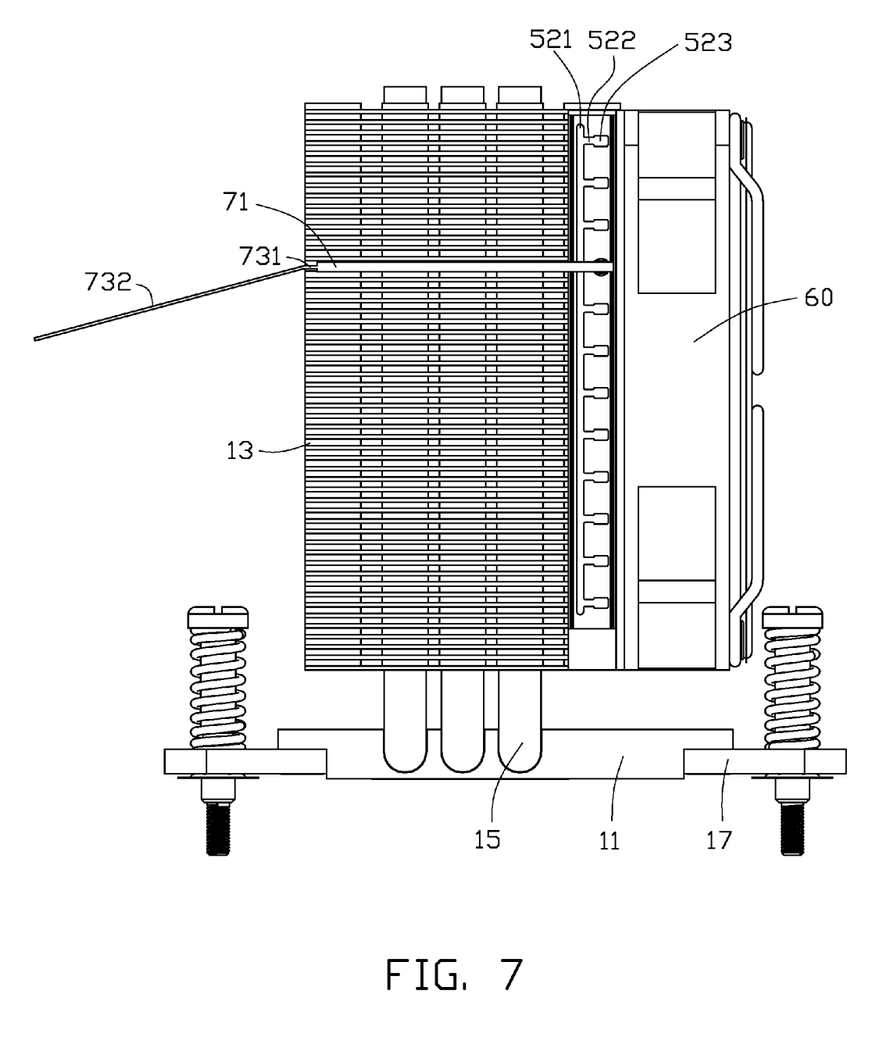
FIG. 7 is a view similar to FIG. 6, with the guiding member being further moved along the adjusting member to reach another locked position in a different height of the adjusting member.

When a height of guiding member 70 relative to the printed circuit board 90 needs to be adjusted, in operation, the fixing arms 71 are pressed towards the adjusting members 50 so that the springs 78 are compressed. At the same time, the engaging portions 796 are brought to exit from the position holes 523 and the movable portions 716 are brought to enter into the position holes 523. Then, the guiding member 70 is pushed backwards to bring the movable portions 716 to slide along the horizontal recesses 522. The tongue 731 separates from the fin assembly 13. Referring also to FIGS. 6-7, since the diameter of each movable portion 716 is smaller than the height of each horizontal recess 522 and the width of each vertical recess 521, the movable portions 716 can moved rewards along the horizontal recesses 522 to reach the vertical recesses 521, from which the movable portions 716 can be moved to slide downwardly or upwardly along the vertical recesses 521 of the adjusting members 50 to reach a desired height. Then each movable portion 716 can be moved to enter another position hole 523 via a corresponding horizontal recess 522. The tongue 731 is inserted in the fin assembly 13 and engaged between two adjacent fins 132 again. Finally, the inward pushing forces on the fixing arms 71 are released and the springs 78 are returned to their original shapes, whereby each movable portion 716 leaves from the position hole 523 and each engaging portions 796 enters the position hole 523. Accordingly, the guiding member 70 is firmly located at the new position having a different height relative to the printed circuit board 90.

As described above, a portion of the airflow out of the fin assembly 13 is guided by the guiding plate 73 downwardly to blow the secondary heat-generating electronic components 85 located aside the main heat-generating electronic component 81. Furthermore, the height of the guiding member 70 can be adjusted by moving the movable portions 716 along the horizontal recesses 522 and vertical recesses 521; thus, the heat dissipation device in accordance with the present invention can cool the secondary heat-generating electronic components 85 in different layouts which have different heights.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A heat dissipation device comprising:
a heat sink comprising a plurality of fins defining a plurality of passageways therebetween, the passageways having an inlet and an outlet;
a fan located at the inlet of the passageways of the heat sink for providing airflow to the heat sink;
two adjusting members mounted at two opposite sides of the heat sink; and
a guiding member positioned at the outlet of the passageways of the heat sink for guiding the airflow to electronic components around the heat dissipation device;
wherein the guiding member engages the adjusting members and can move vertically relative to the adjusting members, thereby adjusting a height of the guiding member along a height of the heat sink;
wherein the guiding member has two fixing arms respectively engaging with the two adjusting members and a tongue embedded into the heat sink, thereby attaching the guiding member to the heat sink; and
wherein each of the adjusting members defines a vertical recess therein, and each of the fixing arms has a movable portion extending therefrom and slideable in the vertical recess of one corresponding adjusting member.

2. The heat dissipation device of claim 1, wherein the guiding member further comprises a guiding plate extending downwardly and rearwards from the heat sink, the tongue integrally extending horizontally from a front edge of the guiding plate and engaging in one of the passageways between two adjacent fins of the heat sink.

3. The heat dissipation device of claim 1, wherein the guiding member further comprises two fasteners connecting the movable portions, respectively, and each of the fasteners is located between the heat sink and a corresponding adjusting member.

4. The heat dissipation device of claim 3, wherein the guiding member further comprises two springs each sandwiched between each arm thereof and the corresponding adjusting member, the movable portion being surrounded by a corresponding spring.

5. The heat dissipation device of claim 4, wherein each of the adjusting members defines a plurality of position holes communicating with the vertical recess, one of the position holes receiving a corresponding fastener therein.

6. The heat dissipation device of claim 5, wherein a height of each position hole is larger than a width of the vertical recess.

7. The heat dissipation device of claim 6, wherein each of the adjusting members defines a plurality of horizontal recesses communicating the vertical slot with the position holes.

8. The heat dissipation device of claim 6, wherein each fastener has an engaging portion connecting with a corresponding movable portion and a blocking portion formed at an end of the engaging portion distant from the corresponding movable portion.

9. The heat dissipation device of claim 8, wherein the engaging portion of each fastener has a diameter larger than the width of the vertical recess and smaller than the height of the position hole, the blocking portion having a diameter larger than the height of the position hole.

10. The heat dissipation device of claim 1, wherein each adjusting member comprises a main plate and two supporting walls secured to the heat sink and spacing the main plate a distance from the heat sink.

11. A heat dissipation device comprising:
a heat spreader for absorbing heat from a main heat-generating electronic component;
a fin assembly comprising a plurality of fins arranged on the heat spreader, a plurality of passageways defined between the fins;
a fan located at an inlet of the passageways for providing airflow to the fin assembly;
at least an adjusting member mounted at a lateral side of the fin assembly; and
a guiding member comprising a guiding plate positioned at an outlet of the passageways of the fin assembly for guiding the airflow to secondary heat-generating electronic components around the heat dissipation device, at least a fixing arm engaging the at least an adjusting member and a tongue engaging between two fins of the fin assembly;
wherein the guiding member can move vertically relative to the at least an adjusting member, thereby adjusting a height of the guiding member along a height of the heat sink; and
wherein the at least an adjusting member defines a vertical recess from a bottom end to a top end thereof, and the at least a fixing arm of the guiding member has a movable portion extending therefrom which can slide in the vertical recess of the at least an adjusting member.

12. The heat dissipation device of claim 11, wherein the guiding member further comprises at least a spring and at least a fastener, the movable portion connecting with the at least a fastener, the at least a fastener having a diameter larger than a width of the vertical recess, the at least a spring surrounding the movable portion.

13. The heat dissipation device of claim 12, wherein the at least an adjusting member further defines a plurality of position holes communicating with the vertical recess, the at least a fastener being received in one of the position holes.

* * * * *